United States Patent
Takata et al.

(10) Patent No.: US 12,456,626 B2
(45) Date of Patent: Oct. 28, 2025

(54) ETCHING METHOD AND PLASMA PROCESSING APPARATUS

(71) Applicant: Tokyo Electron Limited, Tokyo (JP)

(72) Inventors: Fumiya Takata, Miyagi (JP); Shota Yoshimura, Miyagi (JP); Shinya Morikita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 500 days.

(21) Appl. No.: 17/955,540

(22) Filed: Sep. 29, 2022

(65) Prior Publication Data
US 2023/0086580 A1    Mar. 23, 2023

(30) Foreign Application Priority Data
Sep. 30, 2021 (JP) .................... 2021-161373

(51) Int. Cl.
| | | |
|---|---|---|
| H01L 29/00 | (2006.01) | |
| H01J 37/32 | (2006.01) | |
| H01L 21/02 | (2006.01) | |
| H01L 21/3065 | (2006.01) | |
| H01L 21/67 | (2006.01) | |

(52) U.S. Cl.
CPC .... *H01L 21/3065* (2013.01); *H01J 37/32091* (2013.01); *H01L 21/02175* (2013.01); *H01L 21/02252* (2013.01); *H01L 21/67063* (2013.01)

(58) Field of Classification Search
CPC .......... H01L 21/3065; H01L 21/31116; H01L 21/31144; H01L 21/02175; H01L 21/02252
See application file for complete search history.

(56) References Cited

U.S. PATENT DOCUMENTS

2020/0126804 A1* 4/2020 Dole ................ H01L 21/32133

FOREIGN PATENT DOCUMENTS

| JP | H04-032228 A | 2/1992 |
|---|---|---|
| JP | 2016-157793 A | 9/2016 |
| TW | 201600930 A | 1/2016 |

\* cited by examiner

*Primary Examiner* — Reema Patel
(74) *Attorney, Agent, or Firm* — XSENSUS LLP

(57) ABSTRACT

An etching method includes preparing a substrate including a first region containing a first material and a second region containing a second material different from the first material; and etching the second region with a plasma generated from a processing gas containing a tungsten-containing gas. In the etching, a flow rate of the tungsten-containing gas is the largest among all gases contained in the processing gas except for an inert gas.

20 Claims, 8 Drawing Sheets

ETCHING METHOD AND PLASMA PROCESSING APPARATUS

CROSS-REFERENCE TO RELATED APPLICATIONS

This application is based on and claims priority from Japanese Patent Application No. 2021-161373, filed on Sep. 30, 2021, with the Japan Patent Office, the disclosure of which is incorporated herein in its entirety by reference.

TECHNICAL FIELD

The present disclosure relates to an etching method and a plasma processing apparatus.

BACKGROUND

Japanese Patent Laid-Open Publication No. 2016-157793 discloses a method of selectively etching a substrate through a plasma processing in which a first region formed of silicon oxide is selectively etched with respect to a second region having a recess and formed of silicon nitride. The first region is formed to fill the recess and cover the second region. The first region is etched with plasma generated from a processing gas containing fluorocarbons.

SUMMARY

According to an embodiment, an etching method includes: preparing a substrate including a first region containing a first material and a second region containing a second material different from the first material; and etching the second region with a plasma generated from a processing gas containing a tungsten-containing gas, wherein in the etching, a flow rate of the tungsten-containing gas is the highest among all gases contained in the processing gas except for an inert gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
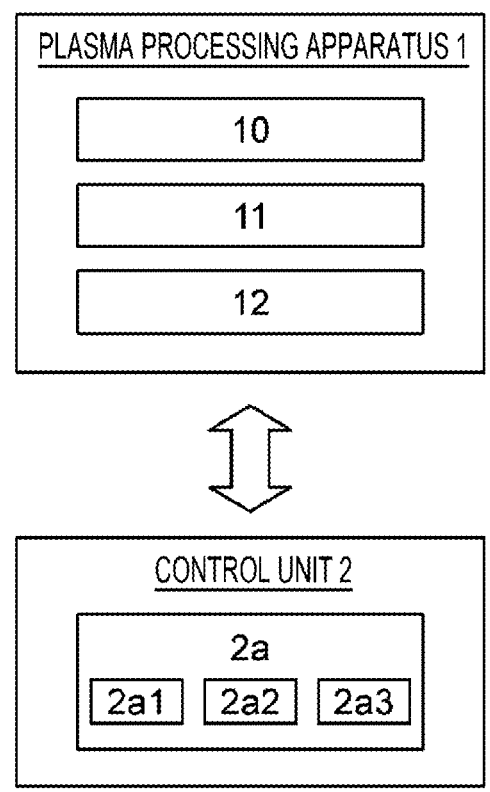
FIG. 1 is a view schematically illustrating a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

According to an embodiment, an etching method includes: preparing a substrate including a first region containing a first material and a second region containing a second material different from the first material; and etching the second region with a plasma generated from a processing gas containing a tungsten-containing gas. In the etching, a flow rate of the tungsten-containing gas is the highest among all gases contained in the processing gas except for an inert gas.

In the etching method above, a recess is formed by etching the second region. According to the etching method, since the flow rate of the tungsten-containing gas is the highest, an amount of deposits caused from the processing gas may be reduced. Thus, it is possible to suppress a phenomenon that the dimension of a recess having a relatively large design dimension shrinks (loading). Therefore, a recess having a favorable shape may be formed.

The tungsten-containing gas may include tungsten hexafluoride gas.

The processing gas may not contain carbon. In this case, an amount of deposits caused from carbon may be reduced.

The processing gas may contain $C_xH_yF_z$ gas (x and z are each an integer of 1 or more, and y is an integer of 0 or more).

In the etching, the second region may be etched while forming a tungsten-containing protective layer on the first region, by exposing the first region and the second region to the plasma. In this case, the first region is hardly etched.

The first material may contain at least one of silicon, silicon nitride, silicon carbide, tungsten, tungsten carbide, and titanium nitride.

According to an embodiment, an etching method includes: preparing a substrate including a first region containing at least one of silicon and metal and a second region containing silicon and oxygen; and etching the second region with a plasma generated from a processing gas containing tungsten hexafluoride gas and a noble gas. In the etching, a flow rate of the tungsten hexafluoride gas is the highest among all gases contained in the processing gas except for the noble gas.

In the etching method above, a recess is formed by etching the second region. According to the etching method, since the flow rate of the tungsten-containing gas is the highest, an amount of deposits caused from the processing gas may be reduced. Thus, it is possible to suppress a phenomenon that the dimension of a recess having a relatively large design dimension shrinks (loading). Therefore, a recess having a favorable shape may be formed.

According to an embodiment, a plasma processing apparatus includes: a chamber; a substrate support that supports a substrate in the chamber; a gas supply that supplies a processing gas containing a tungsten-containing gas into the chamber; a plasma generator that generates a plasma from the processing gas in the chamber; and a controller. The controller is configured to prepare a substrate including a first region containing a first material and a second region containing a second material different from the first material; and etch the second region with a plasma generated from a processing gas containing a tungsten-containing gas. In the etching, a flow rate of the tungsten-containing gas is the highest among all gases contained in the processing gas except for an inert gas.

In the plasma processing apparatus above, a recess is formed by etching the second region. According to the plasma processing apparatus, since the flow rate of the tungsten-containing gas is the highest, an amount of deposits caused from the processing gas may be reduced. Thus, it is possible to suppress a phenomenon that the dimension of a recess having a relatively large design dimension shrinks (loading). Therefore, a recess having a favorable shape may be formed.

The plasma processing apparatus may be a capacitively coupled plasma processing apparatus.

The plasma processing apparatus may further include: a power supply configured to supply a radio-frequency power and a bias power to the plasma processing apparatus, in order to generate the plasma, wherein the controller is configured to control the power supply to: (a) in a first period, set the radio-frequency to a first power and setting the bias power to a second power lower than the first power, thereby forming a tungsten-containing protective layer on the first region, (b) in a second period subsequent to the first period, set the radio-frequency power to a third power lower than the first power and setting the bias power to a fourth power lower than the third power, and (c) in a second period subsequent to the first period, set the radio-frequency power to a fifth power lower than the first power and setting the bias power to a sixth power higher than the fourth power, thereby etching the second region.

Hereinafter, various embodiments will be described in detail with reference to the drawings. In the respective drawings, similar or corresponding portions will be denoted by the same reference numerals.

FIG. 1 is a view illustrating an example of a configuration of a plasma processing system. In an embodiment, a plasma processing system includes a plasma processing apparatus 1 and a control unit 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generation unit 12. The plasma processing chamber 10 has a plasma processing space. Further, the plasma processing chamber 10 includes at least one gas supply port for supplying at least one processing gas into the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support 11 is disposed in the plasma processing space, and has a substrate support surface for supporting a substrate.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave plasma (HWP), or surface wave plasma (SWP). Various types of plasma generation units including an alternating current (AC) plasma generation unit and a direct current (DC) plasma generation unit may be used. In an embodiment, an AC signal (AC power) used in the AC plasma generation unit has a frequency in the range of 100 kHz to 10 GHz. Thus, the AC signal includes a radio frequency (RF) signal and a microwave signal. In an embodiment, the RF signal has a frequency in the range of 100 kHz-150 MHz.

The control unit 2 processes computer-executable commands for causing the plasma processing apparatus 1 to execute various steps described therein. The control unit 2 may be configured to control each component of the plasma processing apparatus 1 to perform the various steps described herein. In an embodiment, a portion of the control unit 2 or the entire control unit 2 may be included in the plasma processing apparatus 1. The control unit 2 may include a processing unit 2a1, a storage unit 2a2, and a communication interface 2a3. The control unit 2 is implemented by, for example, a computer 2a. The processing unit 2a1 may be configured to read a program from the storage unit 2a2, and perform various control operations by executing the read program. This program may be stored in the storage unit 2a2 in advance, or may be acquired via a medium when necessary. The acquired program is stored in the storage unit 2a2, and read from the storage unit 2a2 to be executed by the processing unit 2a1. The medium may be various storage media readable by the computer 2a, or may be a communication line connected to the communication interface 2a3. The processing unit 2a1 may be a CPU (central processing unit). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 2:
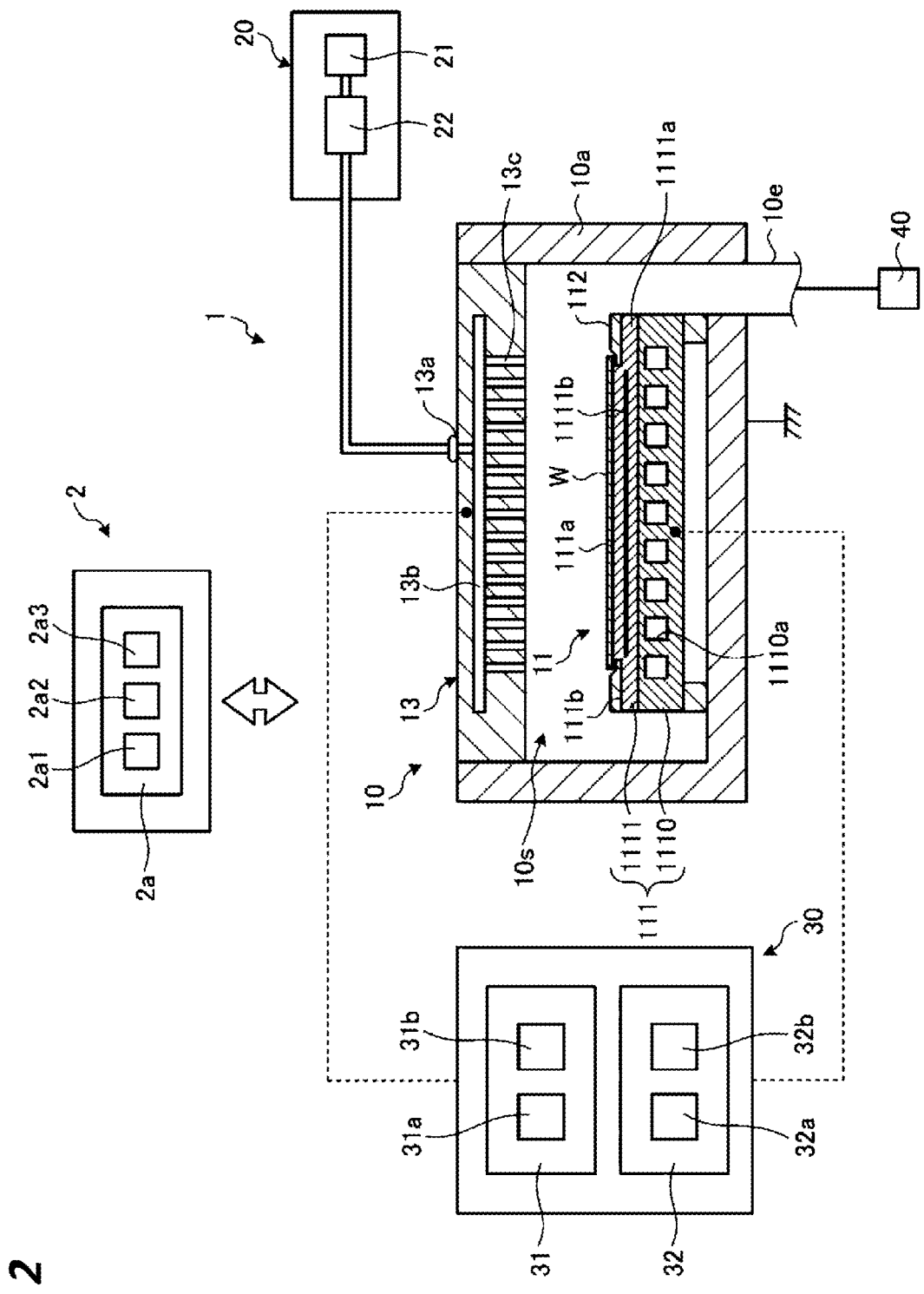
FIG. 2 is a view schematically illustrating a plasma processing apparatus according to an embodiment.

Hereinafter, an example of a configuration of a capacitively coupled plasma processing apparatus which is an example of the plasma processing apparatus 1 will be described. FIG. 2 is a view illustrating an example of a configuration of the capacitively coupled plasma processing apparatus.

The capacitively coupled plasma processing apparatus 1 includes the plasma processing chamber 10, the gas supply 20, a power supply 30, and an exhaust system 40. Further, the plasma processing apparatus 1 includes the substrate support 11 and a gas introduction unit. The gas introduction unit is configured to introduce at least one processing gas into the plasma processing chamber 10. The gas introduction unit includes a shower head 13. The substrate support 11 is disposed inside the plasma processing chamber 10. The shower head 13 is disposed above the substrate support 11. In an embodiment, the shower head 13 makes up at least a portion of the ceiling of the plasma processing chamber 10. The plasma processing chamber 10 has a plasma processing space 10s defined by the shower head 13, the side wall 10a of the plasma processing chamber 10, and the substrate support 11. The plasma processing chamber 10 is grounded. The shower head 13 and the substrate support 11 are electrically insulated from the housing of the plasma processing chamber 10.

The substrate support 11 includes a main body 111 and a ring assembly 112. The main body 111 has a central region 111a for supporting a substrate W, and an annular region 111b for supporting the ring assembly 112. A wafer is an example of the substrate W. The annular region 111b of the main body 111 surrounds the central region 111a of the main body 111 in a plan view. The substrate W is placed on the central region 111a of the main body 111, and the ring assembly 112 is disposed on the annular region 111b of the main body 111 to surround the substrate W placed on the central region 111a of the main body 111. Accordingly, the central region 111a is also referred to as a substrate support surface for supporting the substrate W, and the annular region 111*b* is also referred to as a ring support surface for supporting the ring assembly 112.

In an embodiment, the main body 111 includes a base 1110 and an electrostatic chuck 1111. The base 1110 includes a conductive member. The conductive member of the base 1110 functions as a lower electrode. The electrostatic chuck 1111 is disposed on the base 1110. The electrostatic chuck 1111 includes a ceramic member 1111*a* and an electrostatic electrode 1111*b* disposed inside the ceramic member 1111*a*. The ceramic member 1111*a* has the central region 111*a*. In an embodiment, the ceramic member 1111*a* also has the annular region 111*b*. Another member surrounding the electrostatic chuck 1111, such as an annular electrostatic chuck or an annular insulating member, may have the annular region 111*b*. In this case, the ring assembly 112 may be placed on the annular electrostatic chuck or the annular insulating member, or may be placed on both the electrostatic chuck 1111 and the annular insulating member. Further, at least one RF/DC electrode coupled to an RF power supply 31 and/or a DC power supply 32 to be described later may be disposed inside the ceramic member 1111*a*. In this case, at least one RF/DC electrode functions as a lower electrode. When a bias RF signal and/or a DC signal to be described later is supplied to at least one RF/DC electrode, the RF/DC electrode is also referenced as a bias electrode. The conductive member of the base 1110 and at least one RF/DC electrode may function as a plurality of lower electrodes. The electrostatic electrode 1111*b* may function as a lower electrode. Thus, the substrate support 11 includes at least one lower electrode.

The ring assembly 112 includes one or more annular members. In an embodiment, the one or more annular members include one or more edge rings and at least one cover ring. The edge ring is made of a conductive material or an insulating material, and the cover ring is made of an insulating material.

The substrate support 11 may include a temperature adjustment module configured to adjust at least one of the electrostatic chuck 1111, the ring assembly 112, and the substrate to a target temperature. The temperature adjustment module may include a heater, a heat transfer medium, a flow path 1110*a*, or a combination thereof. A heat transfer fluid such as brine and a gas flows through the flow path 1110*a*. In an embodiment, the flow path 1110*a* is formed inside the base 1110, and one or more heaters are disposed inside the ceramic member 1111*a* of the electrostatic chuck 1111. The substrate support 11 may include a heat transfer gas supply unit configured to supply a heat transfer gas to the gap between the back surface of the substrate W and the central region 111*a*.

The shower head 13 is configured to introduce at least one processing gas from the gas supply unit 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. The gas introduction unit may include one or a plurality of side gas injectors (SGI) attached to one or a plurality of openings formed in the side wall 10*a*, in addition to the shower head 13.

The gas supply unit 20 may include at least one gas source 21 and at least one flow rate controller 22. In an embodiment, the gas supply unit 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. The gas supply unit 20 may further include at least one flow rate modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. Thus, plasma is formed from at least one processing gas supplied to the plasma processing space 10*s*. Accordingly, the RF power supply 31 may function as at least a portion of the plasma generation unit 12. By supplying the bias RF signal to at least one lower electrode, a bias potential is generated in the substrate W, so that ion components in formed plasma may be drawn into the substrate W.

In an embodiment, the RF power supply 31 includes a first RF generation unit 31*a* and a second RF generation unit 31*b*. The first RF generation unit 31*a* is coupled to at least one lower electrode and/or at least one upper electrode via at least one impedance matching circuit, and configured to generate a source RF signal (source RF power) for generating plasma. In an embodiment, the source RF signal has a frequency in the range of 10 MHz to 150 MHz. In an embodiment, the first RF generation unit 31*a* may be configured to generate multiple source RF signals with different frequencies. The generated one or more source RF signals are supplied to at least one lower electrode and/or at least one upper electrode.

The second RF generation unit 31*b* is coupled to at least one lower electrode via at least one impedance matching circuit, and configured to generate the bias RF signal (bias RF power). The frequency of the bias RF signal may be the same as or different from the frequency of the source RF signal. In an embodiment, the bias RF signal has a frequency lower than that of the source RF signal. In an embodiment, the bias RF signal has a frequency in the range of 100 kHz to 60 MHz. In an embodiment, the second RF generation unit 31*b* may be configured to generate a plurality of bias RF signals having different frequencies. The generated one or more bias RF signals are supplied to at least one lower electrode. In various embodiments, at least one of the source RF signal and the bias RF signal may be pulsed.

The power supply 30 may include a DC power supply 32 coupled to the plasma processing chamber 10. The DC power supply 32 includes a first DC generation unit 32*a* and a second DC generation unit 32*b*. In an embodiment, the first DC generation unit 32*a* is connected to at least one lower electrode, and configured to generate a first DC signal. The generated first DC signal is applied to at least one lower electrode. In an embodiment, the second DC generation unit 32*b* is connected to at least one upper electrode, and configured to generate a second DC signal. The generated second DC signal is applied to at least one upper electrode.

In various embodiments, the first and second DC signals may be pulsed. In this case, a sequence of voltage pulses is applied to at least one lower electrode and/or at least one upper electrode. The voltage pulses may have rectangular, trapezoidal, or triangular pulse waveforms, or combinations thereof. In an embodiment, a waveform generation unit for generating a sequence of voltage pulses from the DC signal is connected between the first DC generation unit 32*a* and at least one lower electrode. Thus, the first DC generation unit 32*a* and the waveform generation unit make up a voltage pulse generation unit. When the second DC generation unit 32b and the waveform generation unit make up the voltage pulse generation unit, the voltage pulse generation unit is connected to at least one upper electrode. The voltage pulse may have a positive polarity or a negative polarity. The sequence of voltage pulses may include one or more positive voltage pulses and one or more negative voltage pulses in one cycle. The first and second DC generation units 32a and 32b may be provided in addition to the RF power supply 31, and the first DC generation unit 32a may be provided in place of the second RF generation unit 31b.

The exhaust system 40 may be connected to a gas outlet 10e provided at, for example, the bottom of the plasma processing chamber 10. The exhaust system 40 may include a pressure regulating valve and a vacuum pump. The pressure in the plasma processing space 10s is adjusted by the pressure adjusting valve. The vacuum pump may include a turbo molecular pump, a dry pump, or a combination thereof.

Figure 3:
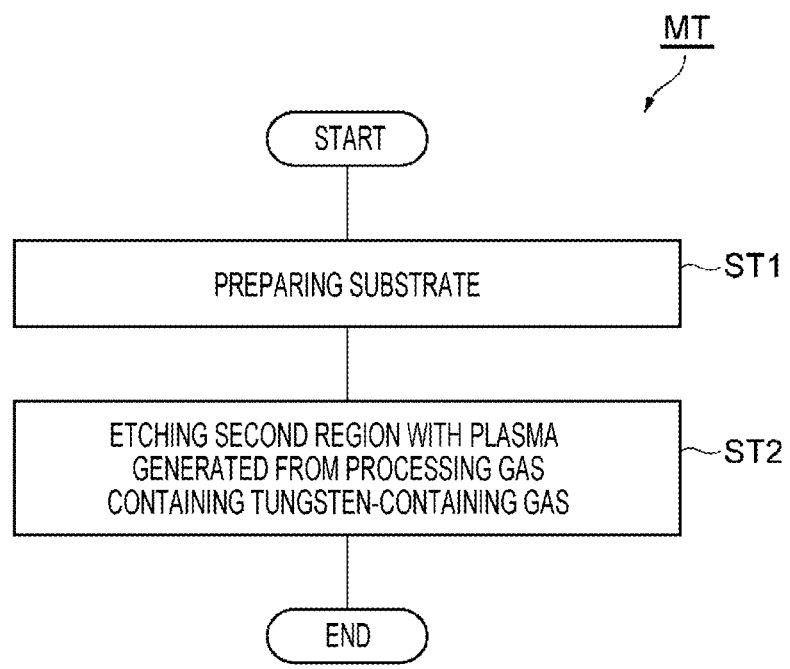
FIG. 3 is a flowchart of an etching method according to an embodiment.

FIG. 3 is a flowchart of an etching method according to an embodiment. The etching method illustrated in FIG. 3 (hereinafter, referred to as a "method MT") may be executed by the plasma processing apparatus 1 of the embodiment described above. The method MT may be applied to the substrate W.

Figure 4:
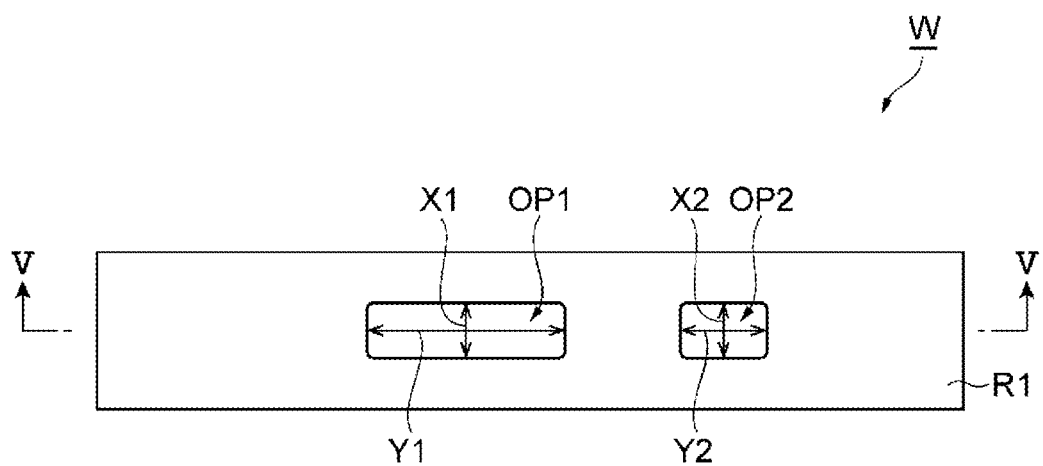
FIG. 4 is a plan view illustrating an example of a substrate to which the method of FIG. 3 may be applied.
Figure 5:
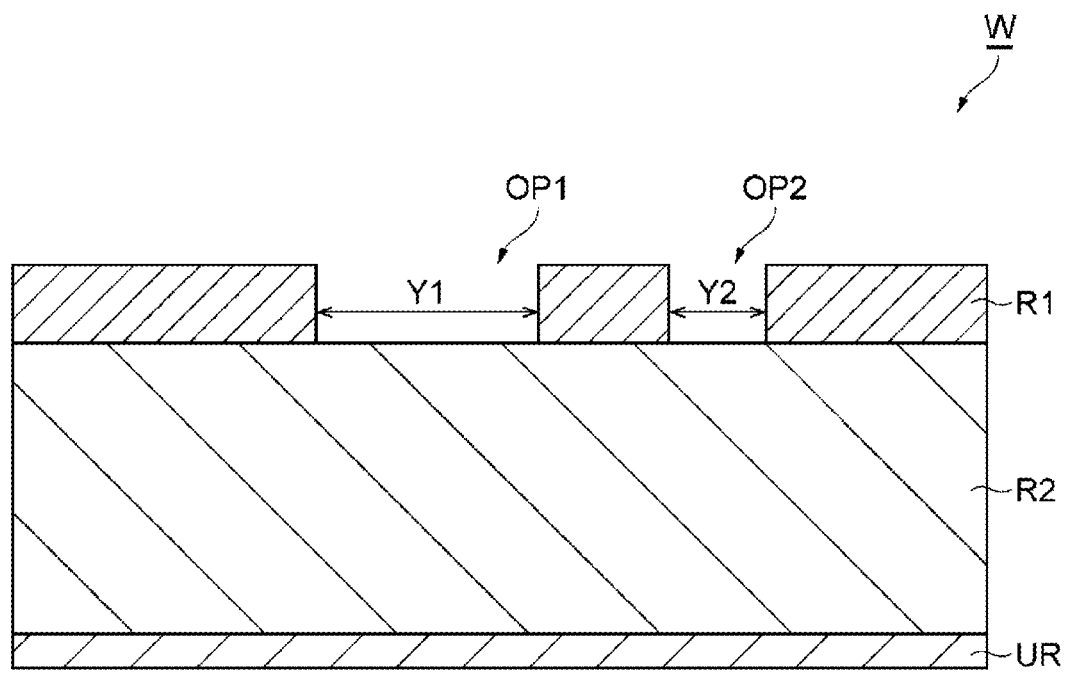
FIG. 5 is a cross-sectional view taken along line V-V of FIG. 4.

FIG. 4 is a plan view illustrating an example of a substrate to which the method of FIG. 3 may be applied. FIG. 5 is a cross-sectional view taken along line V-V of FIG. 4. As illustrated in FIGS. 4 and 5, in an embodiment, the substrate W includes a first region R1 and a second region R2. The first region R1 and the second region R2 may be provided on an underlying region UR. The first region R1 may be provided on the second region R2. The second region R2 may be provided on the underlying region UR. Each of the first region R1 and the second region R2 may be a film formed on the underlying region UR. The second region R2 may be embedded in a recess formed in the first region R1. The second region R2 may be formed to cover the first region R1.

The first region R1 may have a first opening OP1 and a second opening OP2. The first region R1 may be a mask. Each of the first opening OP1 and the second opening OP2 may be an opening for forming a contact hole. The first opening OP1 has a dimension X1 in a first direction and a dimension Y1 in a second direction orthogonal to the first direction. The second opening OP2 has a dimension X2 in the first direction and a dimension Y2 in the second direction orthogonal to the first direction. The first and second directions may be directions along the main surface of the substrate W. The dimension X1 may be the same as the dimension X2. The dimension Y1 may be larger than the dimension Y2. The dimension Y2 may be larger than the dimension X2. Each of the dimensions X1 and X2 (minimum dimension) may be 50 nm or less.

The first region R1 contains a first material. The first material may include at least one of silicon, silicon nitride (SiNx), silicon carbide (SiC), tungsten (W), tungsten carbide (WC), and titanium nitride (TiN$_x$). The first region R1 may include at least one of silicon and metal. The metal may include at least one of tungsten and titanium.

The second region R2 contains a second material different from the first material. The second material may include silicon and oxygen. The second material may include silicon oxide (SiOx).

The underlying region UR may contain at least one of silicon and metal. The underlying region UR may contain silicon and nitrogen. The underlying region UR may contain silicon nitride (SiN$_x$).

Figure 6:
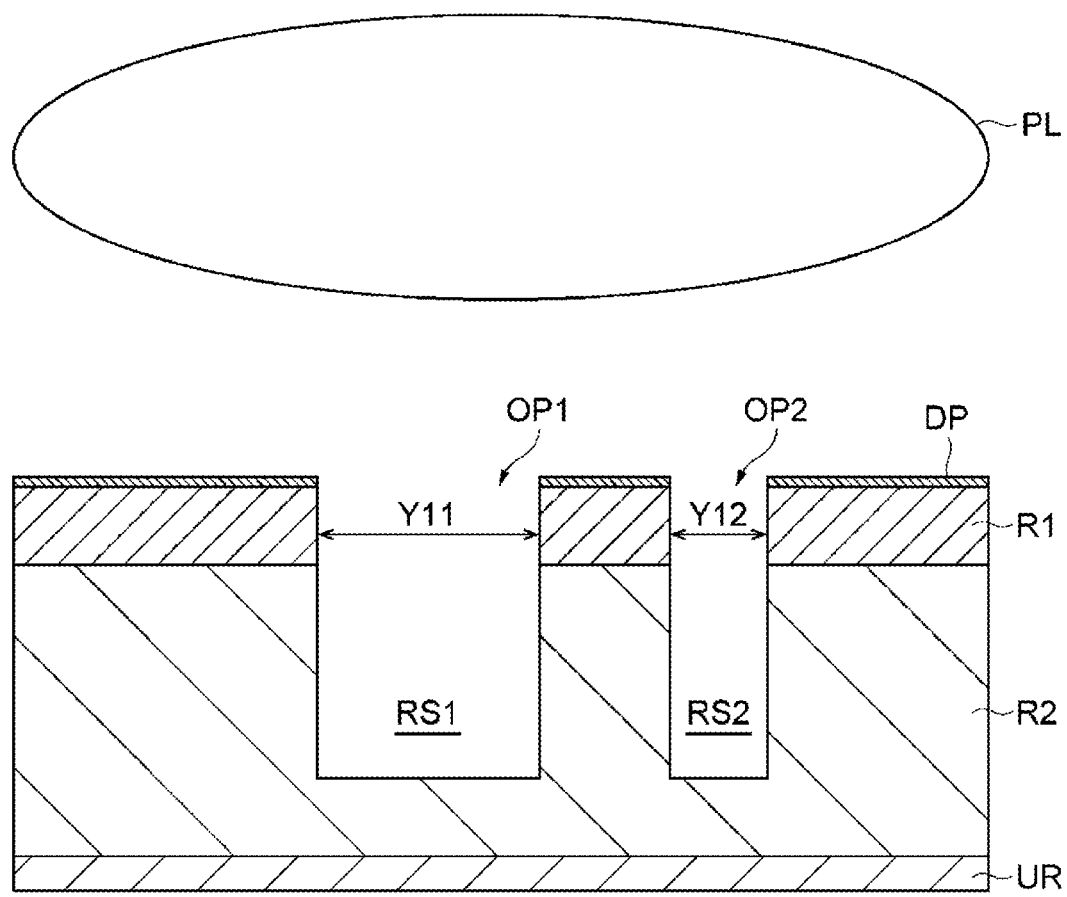
FIG. 6 is a cross-sectional view illustrating a step of an etching method according to an embodiment.

Hereinafter, the method MT will be described with reference to FIGS. 3 to 7, assuming, for example, a case where the method MT is applied to the substrate W using the plasma processing apparatus 1 of the embodiment described above. FIG. 6 is a cross-sectional view illustrating a step of an etching method according to an embodiment. When the plasma processing apparatus 1 is used, the method MT may be executed in the plasma processing apparatus 1 through a control of each component of the plasma processing apparatus 1 by the control unit 2. In the method MT, as illustrated in FIG. 2, a processing is performed on the substrate W on the substrate support 11 (substrate supporting mechanism) disposed in the plasma processing chamber 10.

As illustrated in FIG. 3, the method MT includes steps ST1 and ST2. Steps ST1 and ST2 may be performed in sequence.

In step ST1, the substrate W illustrated in FIGS. 4 and 5 is prepared. The substrate W may be supported by the substrate support 11 inside the plasma processing chamber 10.

In step ST2, as illustrated in FIG. 6, the second region R2 is etched with plasma PL generated from the processing gas containing the tungsten-containing gas. A first recess RS1 corresponding to the first opening OP1 and a second recess RS2 corresponding to the second opening OP2 may be formed in the second region R2. Each of the first recess RS1 and the second recess RS2 may be a contact hole. The bottom of each of the first recess RS1 and the second recess RS2 may reach the upper surface of the underlying region UR. After step ST2 is performed, the first opening OP1 has the dimension Y11, and the second opening OP2 has the dimension Y12. The dimension Y11 is larger than the dimension Y12. The dimension Y11 is larger than the dimension Y1 before step ST2 is performed. The dimension Y12 is larger than the dimension Y2 before step ST2 is performed. In step ST2, the second region R2 may be etched while forming a tungsten-containing protective layer DP on the first region R1, by exposing the first region R1 and the second region R2 to the plasma PL.

The etching may be performed as follows. First, the processing gas containing the tungsten-containing gas is supplied into the plasma processing chamber 10 by the gas supply unit 20. Subsequently, the plasma generation unit 12 generates the plasma PL from the processing gas in the plasma processing chamber 10. The control unit 2 controls the gas supply unit 20 and the plasma generation unit 12 such that the second region R2 is etched with the plasma PL.

The processing gas may not contain carbon. The processing gas may contain $C_xH_yF_z$ (where x and z are each an integer of 1 or more, and y is an integer of 0 or more) gas. The processing gas may contain an inert gas. Examples of the inert gas include a noble gas. Examples of the noble gas include helium gas, neon gas, argon gas, krypton gas, and xenon gas. The processing gas may or may not contain oxygen. The processing gas may contain an oxygen-containing gas. The oxygen-containing gas may include at least one of $O_2$ gas, CO gas, and $CO_2$ gas.

The tungsten-containing gas may include tungsten halide gas. The tungsten halide gas may include at least one of tungsten hexafluoride ($WF_6$) gas, tungsten hexabromide ($WBr_6$) gas, tungsten hexachloride ($WCl_6$) gas, and $WF_5Cl$ gas. The purity of the tungsten halide gas may be 99% or more, 99.9% or more, 99.99% or more, or 99.999% or more. The tungsten-containing gas may include hexacarbonyl tungsten ($W(CO)_6$) gas.

In step ST2, the flow rate of the tungsten-containing gas is the highest among all of the gases contained in the processing gas except for the inert gas. The control unit 2 controls the gas supply unit 20 such that the flow rate of the tungsten-containing gas becomes the highest among all of the gases contained in the processing gas except for the inert gas. The flow rate of the tungsten-containing gas may be 10 sccm or less. The flow rate of the $C_xH_yF_z$ (where x and z are each an integer of 1 or more, and y is an integer of 0 or more) gas may be 4 sccm or less. The flow rate of the oxygen gas may be 4 sccm or less.

In step ST2, the temperature of the substrate support 11 may be 100° C. or higher, 120° C. or higher, 130° C. or higher, 140° C. or higher, or 150° C. or higher. Further, the temperature of the substrate support 11 may be 250° C. or lower, or 200° C. or lower.

In step ST2, the pressure in the plasma processing chamber 10 may be 1 mTorr (0.1333 Pa) or more, or 10 mTorr (1.333 Pa) or more. Further, the pressure in the plasma processing chamber 10 may be 50 mTorr (6.665 Pa) or less, or 30 mTorr (3.999 Pa) or less.

When the flow rate of the carbon-containing gas is the highest among all of the gases contained in the processing gas except for the inert gas, deposits containing carbon may easily adhere to a recess having a large design dimension. As a result, in the recess having the large design dimension, a phenomenon that the dimension of the recess shrinks (loading) occurs. Meanwhile, according to the method MT described above, the flow rate of the tungsten-containing gas is the highest, so that the amount of deposits caused from the processing gas may be reduced. Thus, it is possible to suppress the phenomenon that the dimension Y1 of the first opening OP1 (the dimension of the first recess RS1) having the large design dimension shrinks (loading). Therefore, the first recess RS having a favorable shape may be formed. Further, the sidewall of the first recess RS1 has a vertical shape. According to the method MT, the etching amount of the first region R1 by the plasma PL is small. As a result, the etching selection ratio of the second region R2 with respect to the first region R1 may be improved. The etching rate of the second region R2 may also be improved.

Figure 7:
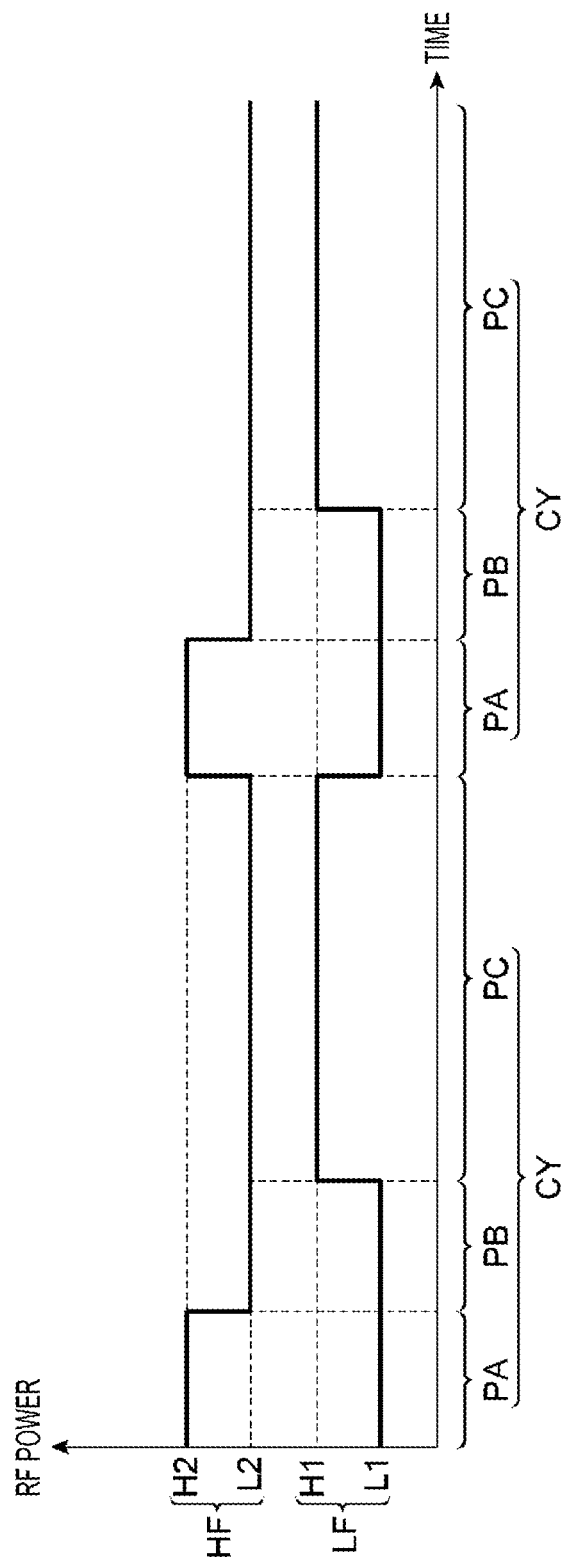
FIG. 7 is an example of a timing chart illustrating a temporal change in RF power applied to an electrode in a main body and RF power applied to a counter electrode.

FIG. 7 is an example of a timing chart illustrating a temporal change in bias power applied to the electrode in the main body 111 of the substrate support 11 and RF power applied to the counter electrode. The timing chart is related to step ST2 in the method MT. In step ST2, a bias power may be applied to the electrode in the main body 111. The bias power may be, for example, an RF power LF. The following description relates to an example of a power used for a substrate having a diameter of 300 millimeters. The RF power LF may be 10 W or more and 300 W or less, 30 W or more and 200 W or less, or 50 W or more and 100 W or less. The frequency of the RF power LF may be 100 kHz or more and 40.68 MHz or less. When the RF power LF is small, the etching of the first region R1 by ions in the plasma PL is suppressed. In step ST2, an RF power HF may be applied to the counter electrode. The RF power HF may be 50 W or more and 1,000 W or less, 80 W or more and 800 W or less, or 100 W or more and 500 W or less. The frequency of the RF power HF may be 27 MHz or more and 100 MHz or less. The RF power LF and the RF power HF may be applied periodically with a period CY. The bias power may be supplied to the conductive member of the substrate support 11. The RF power HF may be supplied to an antenna including one or more coils.

The ion energy of the plasma PL may be 50 eV ($8.0 \times 10^{-18}$ J) or more and 700 eV ($1.1 \times 10^{-16}$ J) or less, 100 eV ($1.6 \times 10^{-17}$ J) or more and 600 eV ($9.6 \times 10^{-17}$ J) or less, or 120 eV ($1.9 \times 10^{-17}$ J) or more and 500 eV ($8.0 \times 10^{-17}$ J) or less. In the present disclosure, the ion energy may be average ion energy incident on the upper surface of the substrate, or may be expressed as a distribution of the ion energy incident on the upper surface of the substrate.

The cycle CY may include a first period PA, a second period PB, and a third period PC. During the first period PA, the RF power HF is maintained at a high power H2 (first power, e.g., more than 100 W), and the RF power LF is maintained at a low power L1 (second power, e.g., less than 100 W). During the first period PA, the deposition of the tungsten-containing protective layer DP is accelerated. In the second period PB after the first period PA, the RF power HF is maintained at a low power L2 (third power, e.g., less than 200 W), and the RF power LF is maintained at a low power L1 (fourth power, e.g., less than 100 W). The low power L2 is lower than the high power H2, and higher than the low power L1. The low power L1 of the RF power LF during the second period PB may be different from the low power L1 of the RF power LF during the first period PA. For example, the low power L1 of the RF power LF during the second period PB may be higher than the low power L1 of the RF power LF during the first period PA. During the third period PC after the second period PB, the RF power HF is maintained at a low power L2 (fifth power, e.g., less than 200 W), and the RF power LF is maintained at a high power H1 (sixth power, e.g., more than 50 W). The high power H1 is higher than the low power L1, and lower than the high power H2. The low power L2 of the RF power HF during the third period PC may be different from the low power L2 of the RF power HF during the second period PB. For example, the low power L2 of the RF power HF during the third period PC may be lower than the low power L2 of the RF power HF during the second period PB. During the third period PC, the etching of the second region R2 is accelerated. The second period PB is a transition period in which the first period PA transitions to the third period PC. In step ST2, one cycle corresponding to the cycle CY including the first period PA, the second period PB, and the third period PC may be repeated twice or more.

The proportion of the first period PA in the cycle CY is smaller than the proportion of the third period PC in the cycle CY. The proportion of the first period PA in the cycle CY may be 10% or more, or be less than 50%. When the proportion of the first period PA is relatively large, the etching selection ratio of the second region R2 with respect to the first region R1 increases. When the proportion of the first period PA is relatively small, the clogging of the first recess RS1 and the second recess RS2 is suppressed. The proportion of the third period PC in the cycle CY may be 50% or more. When the proportion of the third period PC is relatively large, the etching selection ratio of the second region R2 with respect to the first region R1 increases. The frequency that defines the cycle CY may be 1 kHz or more and 1 MHz or less. The time length of the cycle CY is the reciprocal of the frequency that defines the cycle CY.

The control unit 2 may control the power supply 30 such that the RF power HF and the RF power LF illustrated in FIG. 7 are supplied to the plasma processing apparatus 1. The control unit 2 may control the power supply 30 such that a fixed RF power HF and a fixed RF power LF are supplied to the plasma processing apparatus 1.

While various embodiments have been described, various additions, omissions, substitutions, and changes may be made without being limited to the above-described embodiments. Further, different elements in the different embodiments may be combined with each other to form another embodiment.

Hereinafter, various experiments conducted for evaluating the method MT1 will be described. The experiments described below do not limit the present disclosure.

First Embodiment

In a first experiment, the substrate W including the first region R1 containing tungsten carbide (WC) and the second region R2 containing silicon oxide ($SiO_x$) was prepared (see, e.g., FIGS. 4 and 5). The first region R1 has the first opening OP1 having the dimension Y1 and the second opening OP2 having the dimension Y2. Then, step ST2 was performed on the substrate W by using the plasma processing apparatus 1. In step ST2, the processing gas was a mixed gas of tungsten hexafluoride gas ($WF_6$) and argon gas.

Second Experiment

In a second experiment, the same method as that of the first experiment was executed, except that in step ST2, a mixed gas of tungsten hexafluoride gas ($WF_6$), $C_4F_6$ gas, oxygen gas ($O_2$), and argon gas was used as the processing gas. The flow rate of tungsten hexafluoride gas ($WF_6$) was higher than that of $C_4F_6$ gas, and also higher than that of oxygen gas ($O_2$).

Third Experiment

In a third experiment, the same method as that of the first experiment was executed, except that in step ST2, a mixed gas of $CF_4$ gas, $C_4F_6$ gas, oxygen gas ($O_2$), and argon gas was used as the processing gas.

Fourth Experiment

In a fourth experiment, the same method as that of the first experiment was executed, except that in step ST2, a mixed gas of $C_4F_6$ gas, oxygen gas ($O_2$), and argon gas was used as the processing gas.

(TEM Image)

Figure 8:
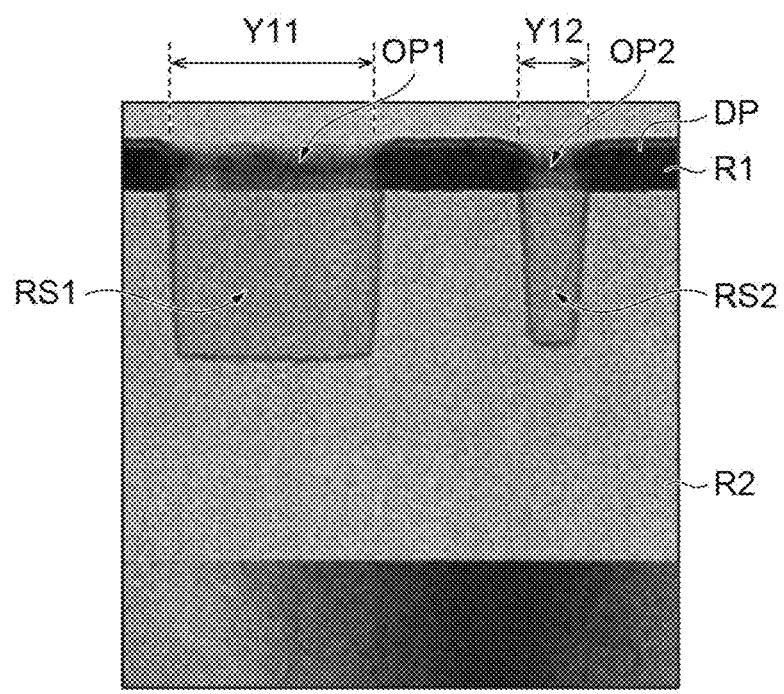
FIG. 8 is a view illustrating an example of a TEM image of a cross section of a substrate obtained by performing an etching method in a first experiment.

FIG. 8 is a view illustrating an example of a TEM image of the cross section of the substrate obtained by executing the etching method in the first experiment. As illustrated in FIG. 8, the second region R2 was etched, so that the first recess RS1 and the second recess RS2 were formed. The sidewalls of the first recess RS1 and the second recess RS2 each had a vertical shape. In the first experiment, it was confirmed that the tungsten-containing protective layer DP was formed on the first region R1.

(Loading)

In the first experiment, a difference between the dimension Y1 of the first opening OP1 before the performance of step ST2 and the dimension Y11 of the first opening OP1 after the performance of step ST2 was measured. The value of Y11-Y1 was 2.0 nm. Thus, it may be confirmed that the dimension of the first opening OP1 increased by 2.0 nm when step ST2 was performed. Further, in the first experiment, a difference between the dimension Y2 of the second opening OP2 before the performance of step ST2 and the dimension Y12 of the second opening OP2 after the performance of step ST2 was measured. The value of Y12-Y2 was 0.9 nm. Thus, it may be confirmed that the dimension of the second opening OP2 increased by 0.9 nm when step ST2 was performed. The increase (2.0 nm) in dimension of the first opening OP1 having the large design dimension is larger than the increase (0.9 nm) in dimension of the second opening OP2 having the small design dimension. Thus, a reverse loading of 1.1 nm was confirmed. The reverse loading is a phenomenon that the increase in dimension of the opening having the large design dimension becomes larger than the increase in dimension of the opening having the small design dimension.

In the second experiment, the value of Y11-Y1 was 3.3 nm, and the value of Y12-Y2 was 0.6 nm. Thus, a reverse loading of 2.7 nm was confirmed.

In the third experiment, the value of Y11-Y1 was 8.5 nm, and the value of Y12-Y2 was 4.3 nm. Thus, a reverse loading of 4.2 nm was confirmed.

In the fourth experiment, the value of Y11-Y1 was-0.8 nm, and the value of Y12-Y2 was-0.4 nm. Thus, a forward loading of 0.4 nm was confirmed. The forward loading is a phenomenon that the decrease in dimension of the opening having the large design dimension becomes larger than the decrease in dimension of the opening having the small design dimension.

(Etching Selection Ratio)

In the first experiment, a difference between a thickness TH1 of the tungsten-containing film (first region R1) before the performance of step ST2 and a thickness of the tungsten-containing film (first region R1 and tungsten-containing protective layer DP) after the performance of step ST2 was measured. The value of TH2-TH1 was 6.1 nm. Meanwhile, the depth of the first recess RS1 was 95.2 nm. This indicates that the etching selection ratio of the second region R2 with respect to the first region R1 is infinite. In other words, the first region R1 is not etched at all, compared to the second region R2.

In the second experiment, the value of TH2-TH1 was -1.8 nm. Meanwhile, the depth of the first recess RS1 was 164.1 nm. Thus, the etching selection ratio of the second region R2 with respect to the first region R1 was 91.2.

In the third experiment, the value of TH2-TH1 was -15.0 nm. Meanwhile, the depth of the first recess RS1 was 180.4 nm. Thus, the etching selection ratio of the second region R2 with respect to the first region R1 was 12.0.

In the fourth experiment, the value of TH2-TH1 was -4.6 nm. Meanwhile, the depth of the first recess RS1 was 68.7 nm. Thus, the etching selection ratio of the second region R2 with respect to the first region R1 was 15.0.

From the results of Experiments 1 to 4, it may be confirmed that the reverse loading and the high etching selection ratio were achieved when the flow rate of the tungsten-containing gas was the highest among all of the gases contained in the processing gas except for the inert gas.

The present disclosure further includes the following aspects.

Appendix 1

An etching gas composition for etching a silicon-containing film, including: a tungsten-containing gas, wherein a flow rate of the tungsten-containing gas is the highest among all of gases contained in the etching gas composition except for an inert gas.

Appendix 2

The etching gas composition described in (Appendix 1), wherein the tungsten-containing gas includes tungsten hexafluoride gas.

Appendix 3

The etching gas composition described in (Appendix 2), wherein a purity of the tungsten hexafluoride gas is 99% or more.

Appendix 4

The etching gas composition described in any one of (Appendix 1) to (Appendix 3), wherein the etching gas composition does not contain carbon.

Appendix 5

The etching gas composition described in any one of (Appendix 1) to (Appendix 3), wherein the etching gas composition contains $C_xH_yF_z$ gas (x and z are each an integer of 1 or more, and y is an integer of 0 or more).

According to an embodiment, it is possible to provide an etching method and a plasma processing apparatus which are capable of forming a recess having a favorable shape.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
    preparing a substrate including a first region containing a first material and a second region containing a second material different from the first material; and
    etching the second region with a plasma generated from a processing gas containing a tungsten-containing gas and a carbon-containing gas,
    wherein in the etching, a flow rate of the tungsten-containing gas is largest among all gases contained in the processing gas except for an inert gas.

2. The etching method according to claim 1, wherein the tungsten-containing gas includes tungsten hexafluoride gas.

3. The etching method according to claim 1, wherein the processing gas does not contain carbon.

4. The etching method according to claim 1, wherein in the etching, the second region is etched while forming a tungsten-containing protective layer on the first region, by exposing the first region and the second region to the plasma.

5. The etching method according to claim 1, wherein the first material contains at least one selected from the group comprising silicon, silicon nitride, silicon carbide, tungsten, tungsten carbide, and titanium nitride.

6. The etching method according to claim 1, wherein the first region is a mask provided on the second region, the first region having at least one opening exposing the second region, and the second region is a film formed on an underlying region.

7. The etching method according to claim 6, wherein the at least one opening includes a first opening and a second opening, the first opening having a dimension in a first direction along a main surface of the substrate that is larger than a dimension of the second opening in the first direction.

8. The etching method according to claim 6, wherein the underlying region contains at least one of silicon and nitrogen.

9. The etching method according to claim 1, wherein the second material includes silicon oxide.

10. The etching method according to claim 1, wherein the flow rate of the tungsten-containing gas is 10 sccm or less.

11. The etching method according to claim 1, wherein the etching is performed at a pressure in a plasma processing chamber of 1 mTorr to 50 mTorr.

12. The etching method according to claim 1, wherein the substrate is supported on a substrate support maintained at a temperature of 100° C. to 250° C. during the etching.

13. The etching method according to claim 1, wherein the plasma is generated using a radio-frequency power of 50 W to 1,000 W.

14. An etching method comprising:
    preparing a substrate including a first region containing a first material and a second region containing a second material different from the first material; and
    etching the second region with a plasma generated from a processing gas containing a tungsten-containing gas,
    wherein in the etching, a flow rate of the tungsten-containing gas is largest among all gases contained in the processing gas except for an inert gas, and
    wherein the processing gas contains $C_xH_yF_z$ gas (x and z are each an integer of 1 or more, and y is an integer of 0 or more).

15. An etching method comprising:
    preparing a substrate including:
        a first region containing at least one selected from the group comprising silicon and metal; and
        a second region containing silicon and oxygen; and
    etching the second region with a plasma generated from a processing gas containing tungsten hexafluoride gas, $C_4F_6$ gas and a noble gas,
    wherein in the etching, a flow rate of the tungsten hexafluoride gas is largest among all gases contained in the processing gas except for the noble gas.

16. The etching method according to claim 15, wherein the first region is a mask provided on the second region, the first region having at least a first opening and a second opening exposing the second region, the first opening having a larger dimension than the second opening in a direction along a main surface of the substrate.

17. The etching method according to claim 16, wherein the second region is a film formed on an underlying region containing silicon nitride.

18. The etching method according to claim 16, wherein the etching forms a first recess corresponding to the first opening and a second recess corresponding to the second opening, each recess being a contact hole reaching an underlying region.

19. The etching method according to claim 15, wherein the metal in the first region includes at least one selected from the group comprising tungsten and titanium.

20. The etching method according to claim 15, wherein the etching is performed in a capacitively coupled plasma processing apparatus.

* * * * *